United States Patent
Kristen et al.

(10) Patent No.: US 7,174,972 B2
(45) Date of Patent: Feb. 13, 2007

(54) ELECTRICAL HAND-HELD POWER TOOL WITH NON-CONTACTING ELECTRICAL MANUAL CONTROL SWITCH

(75) Inventors: Ferdinand Kristen, Gilching (DE); Erwin Manschitz, Germering (DE); Hans-Jürgen Pfisterer, Karlsruhe (DE)

(73) Assignee: Hilti Aktiengesellschaft, Schaan (LI)

( * ) Notice: Subject to any disclaimer, the term of this patent is extended or adjusted under 35 U.S.C. 154(b) by 0 days.

(21) Appl. No.: 11/286,039

(22) Filed: Nov. 22, 2005

(65) Prior Publication Data

US 2006/0076153 A1  Apr. 13, 2006

Related U.S. Application Data

(63) Continuation of application No. 10/740,195, filed on Dec. 18, 2003, now abandoned.

(30) Foreign Application Priority Data

Dec. 19, 2002  (DE) ................................ 102 59 569

(51) Int. Cl.
  *B25D 11/00* (2006.01)
  *H01H 9/00* (2006.01)
(52) U.S. Cl. ...................... 173/171; 173/112; 335/207
(58) Field of Classification Search ................ 173/171, 173/115, 112, 170; 200/61.85, 522, 322; 335/205, 206, 207
See application file for complete search history.

(56) References Cited

U.S. PATENT DOCUMENTS

| | | | | |
|---|---|---|---|---|
| 3,350,531 A | * | 10/1967 | Koepke | 200/314 |
| 3,932,830 A | * | 1/1976 | Holtkamp | 337/64 |
| 4,262,181 A | * | 4/1981 | Tufano et al. | 200/296 |
| 4,574,471 A | * | 3/1986 | Dibbern et al. | 29/596 |
| 5,365,155 A | * | 11/1994 | Zimmermann | 318/268 |
| 5,414,793 A | * | 5/1995 | Morikawa | 388/824 |
| 5,867,082 A | * | 2/1999 | Van Zeeland | 335/205 |
| 6,729,016 B2 | * | 5/2004 | Wieger et al. | 29/622 |

* cited by examiner

*Primary Examiner*—Stephen F. Gerrity
*Assistant Examiner*—Paul Durand
(74) *Attorney, Agent, or Firm*—Abelman, Frayne & Schwab

(57) ABSTRACT

An electrical hand-held power tool includes a non-contacting electrical manual control switch (3) having an operating element (4) and a sensor switch (5), a pivotable carrier (6) which carries a switching element (13) and which is manually controlled by the operating element (4) of the manually control switch (3), the sensor switch (5) being connected with the carrier (6) vibration-free, and pivot transmitting device (7) axially displaceable along the vibration axis A) of a vibrating assembly (2) of the power tool relative to the operating element (4) for pivoting the carrier (6) in response to actuation of the operating element (4).

10 Claims, 2 Drawing Sheets

ELECTRICAL HAND-HELD POWER TOOL WITH NON-CONTACTING ELECTRICAL MANUAL CONTROL SWITCH

RELATED APPLICATION

This application is a continuation of application Ser. No. 10/740,195 filed Dec. 18, 2003 now abandoned.

BACKGROUND OF THE INVENTION

The invention relates to an electrical hand-held power tool having a non-contacting electrical manual control switch, in particular to an at least partially percussive chisel hammer or combination hammer.

In electrical hand-held power tools, which are exposed to both high dust loads and strong vibrations because of their intended uses, mechanical contact switches are subject to high wear.

According to U.S. Pat. No. 5,014,793, an electrical hand-held power tool is disclosed that is controlled by a manual control switch, whose operating means operates mechanical piezo-sensors for actuating a power switch. The pressure sensors are in mechanical contact with the operating means, whereby vibrations can be transmitted to the operating means.

According to DE 4 401 664, a combination hammer having a non-contacting electrical manual control switch has a non-contacting electrical Hall sensor switch that is controllable, according to DE 1 994 215, directly by a cam control mechanism, the sensor being non-vibrationally connected via the housing with the operating means. The sensor switch must be connected to the housing to accomplish this.

SUMMARY OF THE INVENTION

The object of the invention is to provide a technologically simple, non-contacting electrical manual control switch, whose sensor switch is insensitive to vibrations of the switch operating means.

This object is achieved essentially by providing an electrical hand-held power tool having an assembly module vibrating along an axis of vibration, and a non-contacting electrical manual control switch with operating means and a sensor switch. The sensor switch is connected vibration-free to a pivotable carrier for means that the switches the control switch between its ON/OFF positions. The pivotable carrier has a pivot axis oriented parallel to the axis of vibration of the vibrating assembly, and can be manually controlled by the operating means, using pivot transmitting means that is axially displaceable to a limited extent parallel to the axis of vibration.

By virtue of the switching means carrier being vibration-free relative to the sensor switch and manually controllable by the operating means that is axially displaceable to a limited extent parallel the axis of vibration, the operating means is isolated from the vibration of the sensor switch, whereby the latter can vibrate relative to the housing without adversely affecting the switching function of the sensor switch or the operating means.

Advantageously, the switching means carrier forms, together with the operating means, a pivotal coupling, preferably, in the form of a coupling pin protruding axially eccentrically from the switching means carrier, and engaging in a coupling guide that forms part of the operating means. Thereby, the non-contacting electrical manual control switch is combined with an operating means displaceably guided in the housing of the electrical hand-held power tool only at the time of final assembly.

The shape of the coupling guide is so selected that an advantageous transformation of the linear movement of the operating means into a pivotal movement of switching means carrier takes place. Thereby, with a coupling guide in the form of a guide slot, a slide switch displaceable transverse to the axis of vibration can easily be realized.

Advantageously, the sensor switch is connected to the vibrating assembly by being cast directly in a motor control electronics. Thereby, preferably, the sensor switch forms an integral component of a vibration-non-sensitive motor control electronics. The sensor switch increases, optionally, the vibrational mass.

The switching means carrier is advantageously configured as a rocker pivotable, within certain limits, in opposite directions, whereby the switching means for the control switch which are carried by the carrier and which is spaced transverse to the pivot axis, can be pivoted only within an arc limited by two end positions, which can be associated with switching positions of the control switch.

Advantageously, the switching means carrier is stable in at least one switching position relative to the sensor switch. Preferably, the switching means carrier is stable in both switching positions, and is elastically preloaded to respective positions, whereby the switching positions are not adversely affected by vibrations.

Advantageously, a leaf spring for biasing the switching means carrier to a switching position is arranged between the switching means carrier and the sensor switch, the leaf spring being technically simple to manufacture.

Advantageously, the switching means is configured as permanent magnets, and the sensor switch is formed as Hall sensor switches that are non-sensitive to dust.

BRIEF DESCRIPTION OF THE DRAWINGS

The invention will now be more completely described with reference to the drawings, wherein.

DETAILED DESCRIPTION OF THE PREFERRED EMBODIMENT

Figure 1:
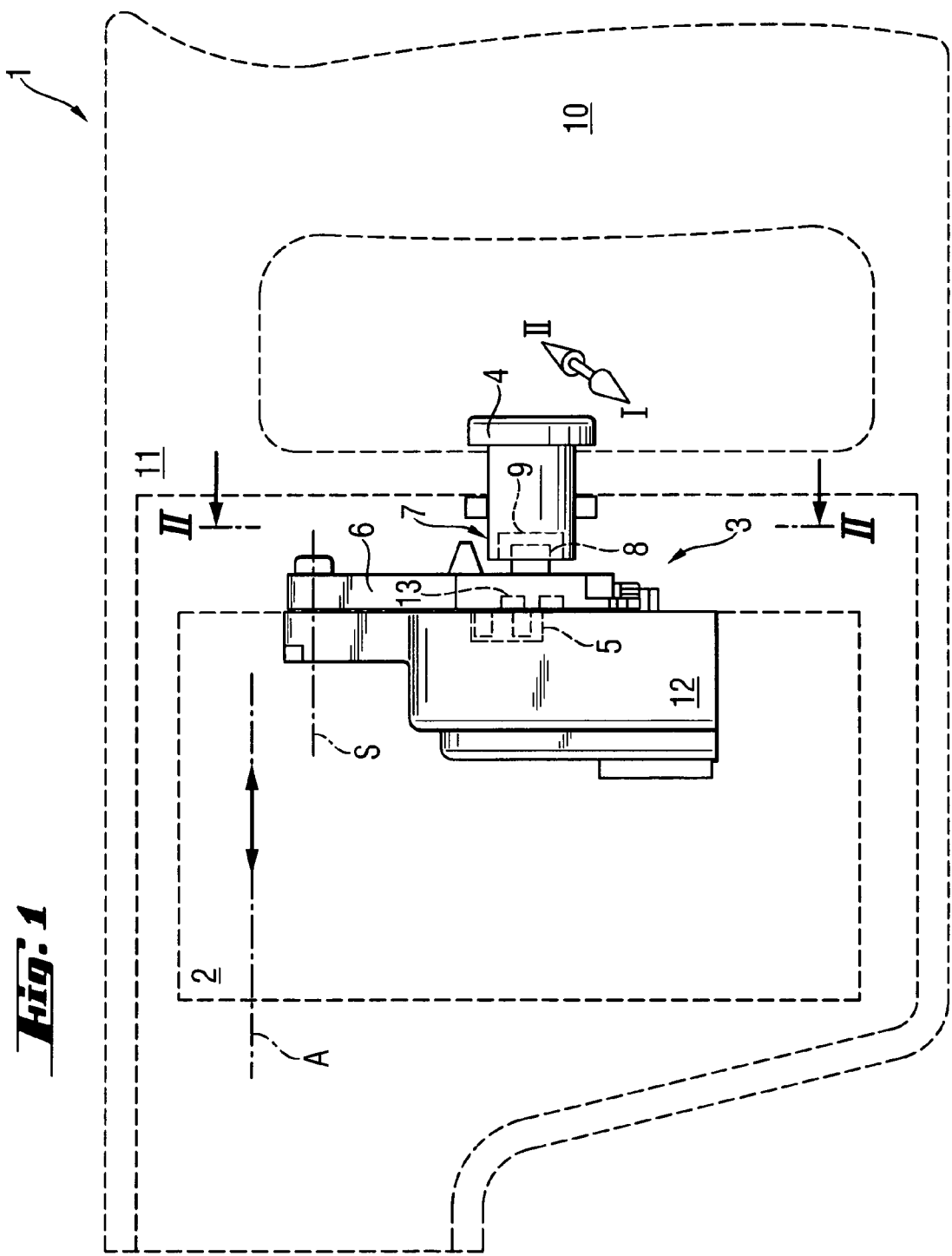
FIG. 1 shows a portion of a vibrating electrical hand-held power tool according to the invention.

According to FIG. 1, a percussive electrical hand-held power tool 1 which is shown only schematically, has an assembly 2 vibrating along an axis of vibration A, and a non-contacting electrical manual control switch 3 having operating means 4 and a sensor switch 5.

The sensor switch 5 is connected vibration-free to a pivotable switching means carrier 6, whose pivot axis is oriented parallel to the axis of vibration A. The manual control switch 3 is manually operated from a handle 10 of the housing 11 of the power tool 1 via pivot transmitting means 7. The pivot transmitting means 7 is formed as a rotary coupling and is arranged with a possibility of a limited axial displacement parallel the vibration axis A. The pivot transmitting means 7 has a coupling pin 8 that axially eccentrically projects from the switching means carrier 6 and engages in a coupling guide 9 of the operating means 4 of the manual control switch 3. The coupling guide 9 that is formed a guide slot extending radially to the pivot axis 5, provides for transformation of the limited linear displacement of the operating means 4, which is displaceable transverse to the plane of the drawing and is formed as a slide switch, into a pivotal movement of the switching means carrier 6. The sensor switch 5 is connected with the vibrating assembly 2 by being cast directly in a vibration-non-sensitive control electronic 12, which increases the vibration mass of the vibrating assembly 2.

Figure 2:
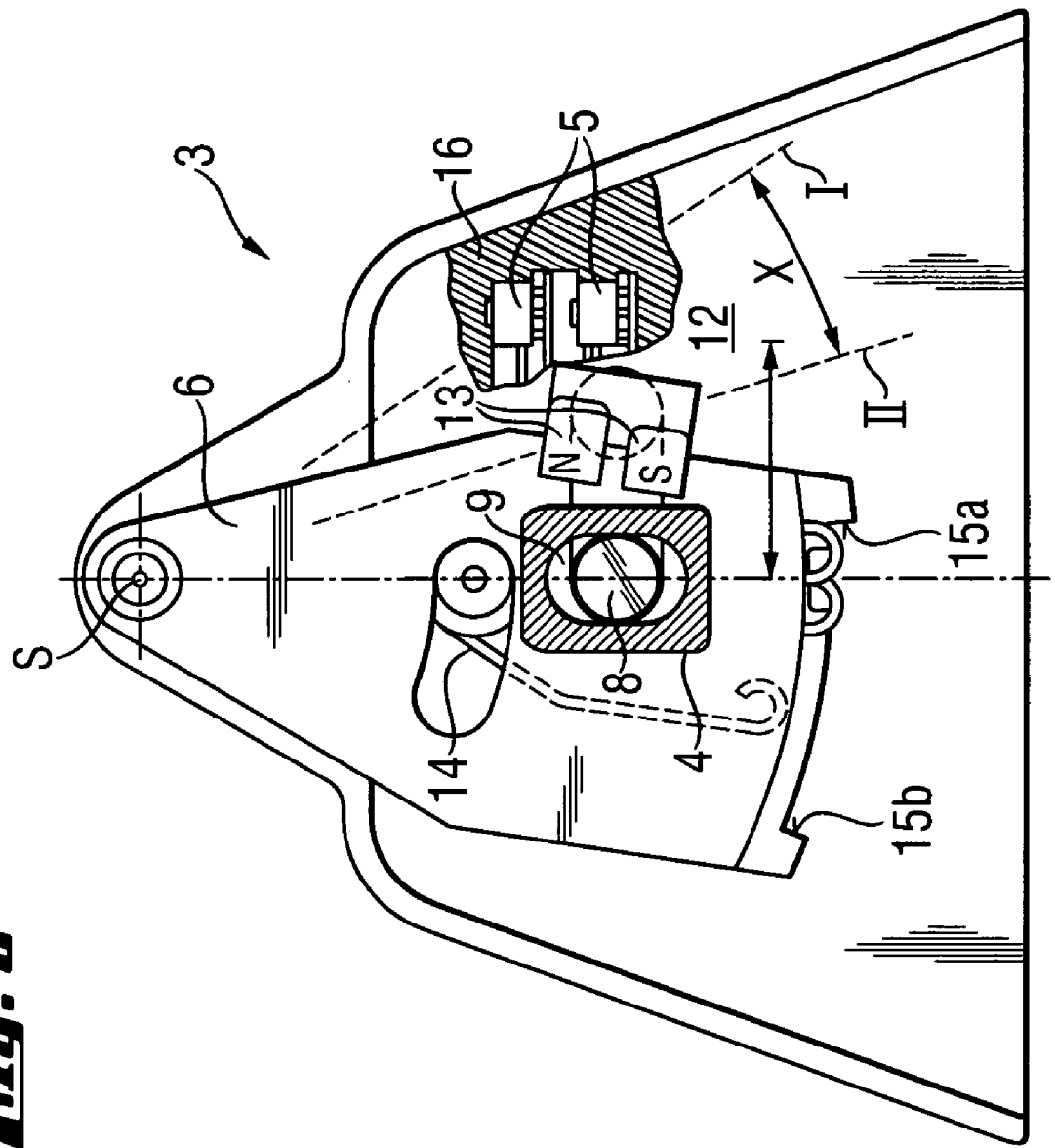
FIG. 2 shows a detail view of the non-contacting manual control switch viewed along the Line II—II of FIG. 1.

As shown in FIG. 2, the switching means carrier 6 is formed as pivotal rocker pivotable to a limited extent in opposite direction and having switching means 13 spaced from the pivot axis 5 and extending transverse thereto. The switching means 13 is formed as two permanent magnets extending parallel to each other and having opposite polarities. The switching means carrier 6 is elastically biased by a leaf spring 14 relative to the sensor switch 5 in both switch positions ON/OFF, remaining stable in each position. Two end step 15*a* and 15*b* limit the displacement of the switching means carrier 6 relative to the sensor switch 5 within an arc X between end positions I and II that define ON/OFF positions of the control switch 3. The sensor switch 5 is formed as a differential Hall sensor switch that is cast in a compound 16 of the motor control electronics 12.

What is claimed is:

1. An electrical hand-held power tool, comprising a housing (11); an assembly (2) arranged in the housing (11) and vibrating along a vibration axis (A), the housing (11) being isolated from the vibrations of the vibrating assembly (2); a non-contacting electrical manual control switch (3) having operating means (4) and a sensor switch (5); switching means (13) for displacing the control switch (3) between ON/OFF positions thereof; a pivotable switching means carrier (6) which is manually controlled by the operating means (4) of the manually control switch (3) and a pivot axis of which is oriented parallel to the vibration axis (A) of the vibrating assembly (2), the sensor switch (5) being connected with the switching means carrier (6) vibration-free; and pivot transmitting means (7) axially displaceable along the vibration axis (A) of the vibrating assembly (2) relative to the operating means (4) for pivoting the switching means carrier (6) in response to actuation of the operating means (4), the pivot transmitting means (7) having a first element (8) associating with the vibrating assembly (2) and a second element (9) associated with the housing (11).

2. The electrical hand-held power tool of claim 1, wherein the pivot transmitting means (7) is formed as a rotary coupling, wherein the first element (8) is formed as a coupling pin projecting axially from the switching means carrier (6), and the second element (9) is formed as a coupling guide provided in the operating means and in which the coupling pin engages.

3. The electrical hand-held power tool of claim 2, wherein the coupling guide (9) has a shape that provides for transformation of linear movement of the operating means in a pivotal movement of the switching means carrier (6).

4. The electrical hand-held power tool of claim 1, wherein the sensor switch (5) is connected to the vibrating assembly (2).

5. The electrical hand-held power tool of claim 4, wherein the sensor switch (5) is encased in a motor control electronics (12).

6. The electrical hand-held power tool of claim 1, wherein the switching means carrier (6) is formed as a rocker pivotable to a limited extent in opposite directions.

7. The electrical hand-held power tool of claim 1, wherein the switching means carrier (6) is stable relative to the sensor switch (5) in at least one switching position thereof.

8. The electrical hand-held power tool of claim 7, further comprising a leaf spring (14) arranged between the switching means carrier (6) and the sensor switch (5) for biasing the switching means carrier (6) to the one switching position thereof.

9. The electrical hand-held power tool of claim 6, wherein the switching means carrier (6) is stable in each of the switching positions thereof.

10. The electrical hand-held power tool of claim 1, wherein the switching means (13) is formed as permanent magnet means, and the sensor switch (5) is a Hall sensor switch.

* * * * *